(12) United States Patent
Nagamine

(10) Patent No.: US 6,843,259 B2
(45) Date of Patent: Jan. 18, 2005

(54) SOLUTION TREATMENT UNIT

(75) Inventor: Shuichi Nagamine, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 305 days.

(21) Appl. No.: 10/115,240

(22) Filed: Apr. 4, 2002

(65) Prior Publication Data
US 2002/0144719 A1 Oct. 10, 2002

(30) Foreign Application Priority Data
Apr. 5, 2001 (JP) .......................................... 2001-107075

(51) Int. Cl.$^7$ ............................................... B08B 3/02
(52) U.S. Cl. ..................... 134/94.1; 134/95.3; 134/99.1; 134/104.1; 134/186; 134/902
(58) Field of Search ............................. 134/94.1, 95.1, 134/95.3, 99.1, 104.1, 155, 186, 902

(56) References Cited

U.S. PATENT DOCUMENTS

| 3,990,462 | A | * | 11/1976 | Elftmann et al. ......... 134/102.1 |
| 4,429,983 | A | * | 2/1984 | Cortellino et al. .......... 396/617 |
| 5,908,657 | A | * | 6/1999 | Kimura et al. ................. 427/9 |
| 5,937,223 | A | * | 8/1999 | Akimoto et al. ............ 396/604 |
| 6,228,561 | B1 | * | 5/2001 | Hasebe et al. ............... 430/311 |
| 6,267,516 | B1 | | 7/2001 | Nagamine et al. |
| 6,270,576 | B1 | * | 8/2001 | Araki et al. .................. 118/52 |
| 6,432,199 | B1 | * | 8/2002 | Takekuma .................... 118/52 |
| 6,494,220 | B1 | * | 12/2002 | Matsuda et al. ......... 134/104.1 |
| 6,589,338 | B1 | * | 7/2003 | Nakamori et al. ............ 118/50 |
| 6,612,315 | B2 | * | 9/2003 | Pascal et al. ............... 134/25.4 |
| 6,652,662 | B1 | * | 11/2003 | Ishihara et al. ............... 134/18 |

FOREIGN PATENT DOCUMENTS

| JP | 4-139823 | * | 5/1992 |
| JP | 10-41270 | * | 2/1998 |
| JP | 2001-35828 | * | 2/2001 |

* cited by examiner

Primary Examiner—Frankie L. Stinson
(74) Attorney, Agent, or Firm—Oblon, Spivak, McClelland, Maier & Neustadt, P.C.

(57) ABSTRACT

The present invention relates to a solution treatment unit for supplying a treatment solution to a substrate to treat the substrate within a treatment container, and an inner container surrounding an outer periphery of the horizontally held substrate with its upper and lower faces open is provided in the treatment container. An exhaust pipe for exhausting an atmosphere in the treatment container is provided in a bottom portion of the treatment container and inside the inner container. An exhaust port of the exhaust pipe is open at a position higher than the bottom portion. A drain port for draining the treatment solution in the treatment container is provided in the bottom portion. According to the present invention, the drain of a solution and the exhaust of an atmosphere can be performed separately without being mixed, and hence pressure loss of a fan on the factory side which performs an exhaust operation can be reduced, resulting in a reduction in excess power consumption.

14 Claims, 13 Drawing Sheets

SOLUTION TREATMENT UNIT

BACKGROUND OF THE INVENTION

1. Field of the Invention

The present invention relates to a solution treatment unit for a substrate.

2. Description of the Related Art

In a photolithography process in semiconductor device fabrication processes, for example, resist coating treatment for coating the surface of a wafer with a resist solution to form a resist film on the wafer, exposure processing for exposing the wafer in a pattern, developing treatment for developing the exposed wafer, and the like are performed in sequence to form a predetermined circuit pattern on the wafer.

A developing treatment unit in which the aforementioned developing treatment is performed includes, for example, a developing solution supply nozzle for supplying a developing solution to the wafer, a spin chuck capable of rotating the wafer while holding it, a cup surrounding the outer periphery of the wafer, and the like. The developing treatment is carried out in such a manner that after the developing solution is supplied to the wafer held by the spin chuck and the wafer is developed in stationary condition for a predetermined period of time, the wafer is cleaned and dried while being rotated.

In the developing treatment, it is necessary to drain the developing solution and the like falling from the wafer and scatted from the wafer and to exhaust impurities floating in the developing treatment unit. Therefore, a drain pipe connected to a fan or the like on the factory side is provided in the lower portion of the cup, and conventionally drainage of the developing solution and the like and an atmosphere including impurities are collectively let out from the drain pipe.

However, if the drain of the developing solution and the like and the exhaust of impurities and the like are performed collectively by the drain pipe as described above, pressure loss occurs to the fan on the factory side which generates suction force of the drain pipe, and hence to maintain a predetermined exhaust quantity, it is necessary to rotate the fan at higher speed than usual. If the fan is maintained at high-speed rotation as described above, the power consumption increases correspondingly, and total running costs of the developing treatment increase. Moreover, the possibility that moist exhausted atmosphere comes in contact with the fan becomes higher, and hence corrosion and the like may occur to the fan.

SUMMARY OF THE INVENTION

The present invention is made in view of the aforesaid point, and its object is to provide a solution treatment unit capable of letting out a gas and a liquid separately on the occasion of treatment, for example, developing treatment with the aid of various kinds of treatment solutions.

To attain the aforementioned object, the present invention is a solution treatment unit for supplying a treatment solution to a substrate to treat the substrate within a treatment container, wherein an inner container surrounding an outer periphery of the horizontally held substrate with its upper and lower faces open is provided in the treatment container, an exhaust pipe for exhausting an atmosphere in the treatment container is provided in a bottom portion of the treatment container and inside the inner container, an exhaust port of the exhaust pipe is open at a position higher than the bottom portion, and a drain port for draining the treatment solution in the treatment container is provided in the bottom portion.

According to the present invention, the inner container surrounding the outer periphery of the substrate with its upper and lower faces open is provided, whereby the treatment solution scattered from the substrate is caught by the inner container and falls on the bottom portion of the treatment container. Since the drain port is provided in the bottom portion, the treatment solution which has fallen on the bottom portion is drained from the drain port. Meanwhile, when the developing solution is supplied, for example, mist of the developing solution and the like are produced and cause the contamination of the substrate. Accordingly, it is required to exhaust the atmosphere in the treatment container from blow in accordance with gravitation at the time of treatment. In the present invention, the exhaust pipe is provided in the bottom portion of the treatment container, whereby the atmosphere in the treatment container can be exhausted suitably from below the treatment container. Moreover, the exhaust port of the exhaust pipe is provided to be open at the position higher than the bottom portion of the treatment container, whereby the entry of the treatment solution which has fallen on the bottom portion into the exhaust port is eliminated, and consequently the drain of the solution and the exhaust of the atmosphere can be performed separately without being mixed.

DETAILED DESCRIPTION OF THE PREFERRED EMBODIMENT

Figure 1:
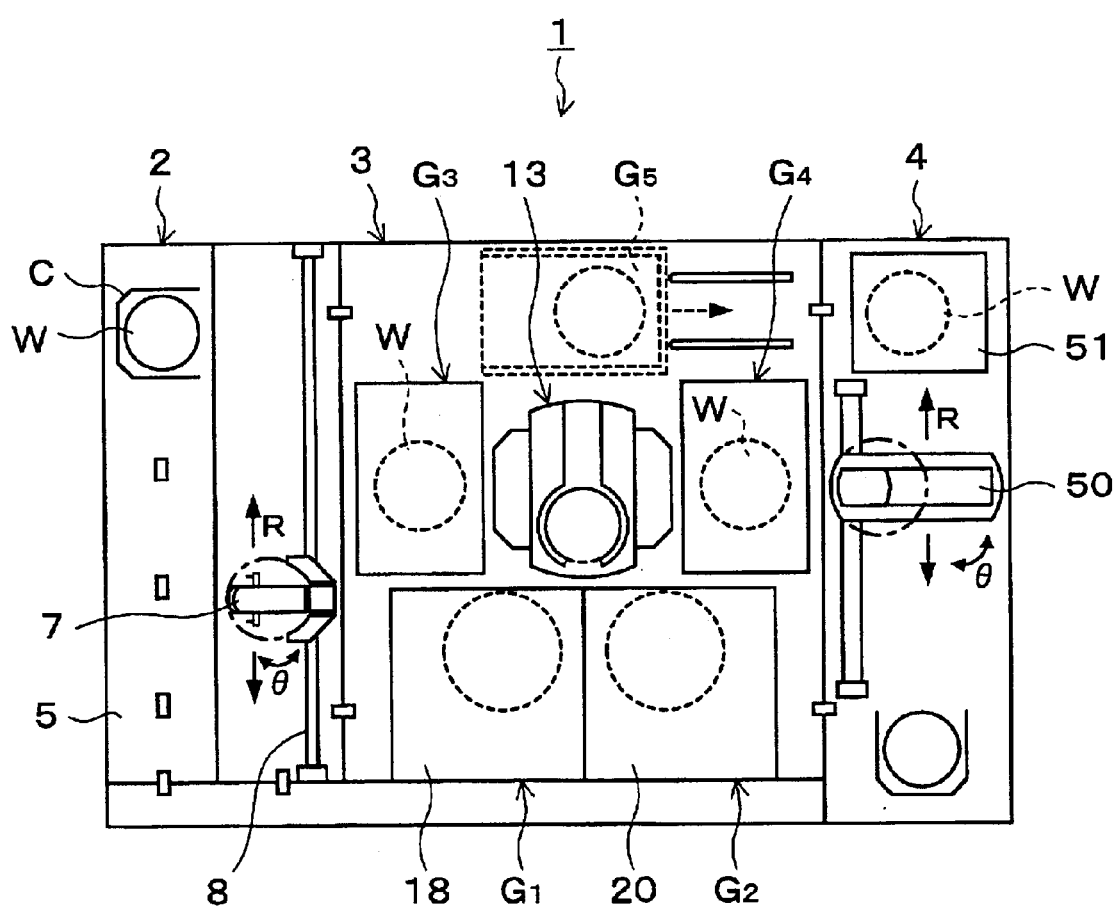
FIG. 1 is a plan view showing a sketch of the structure of a coating and developing treatment system including a developing treatment unit according to an embodiment.
Figure 2:
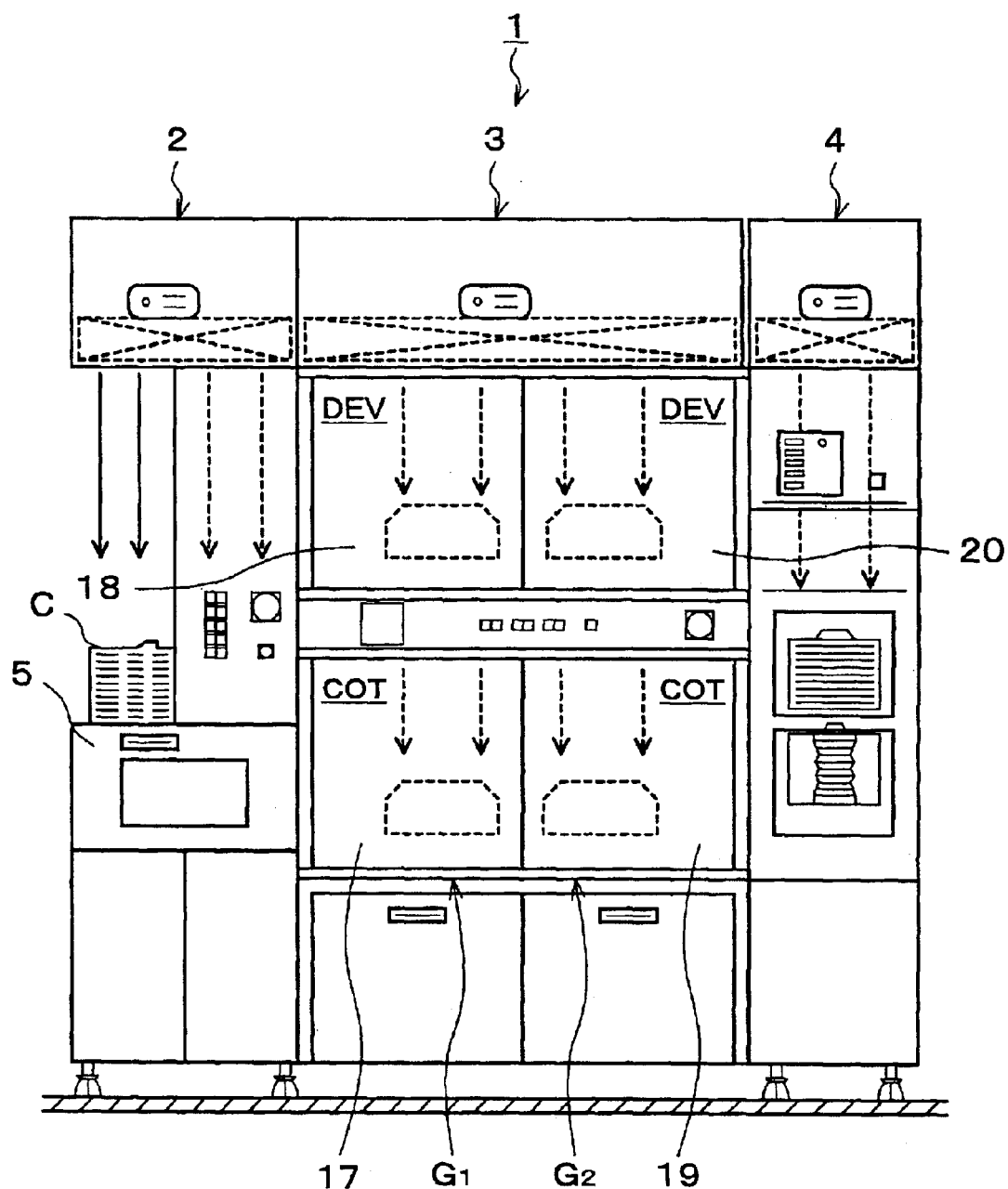
FIG. 2 is a front view of the coating and developing treatment system in FIG. 1.
Figure 3:
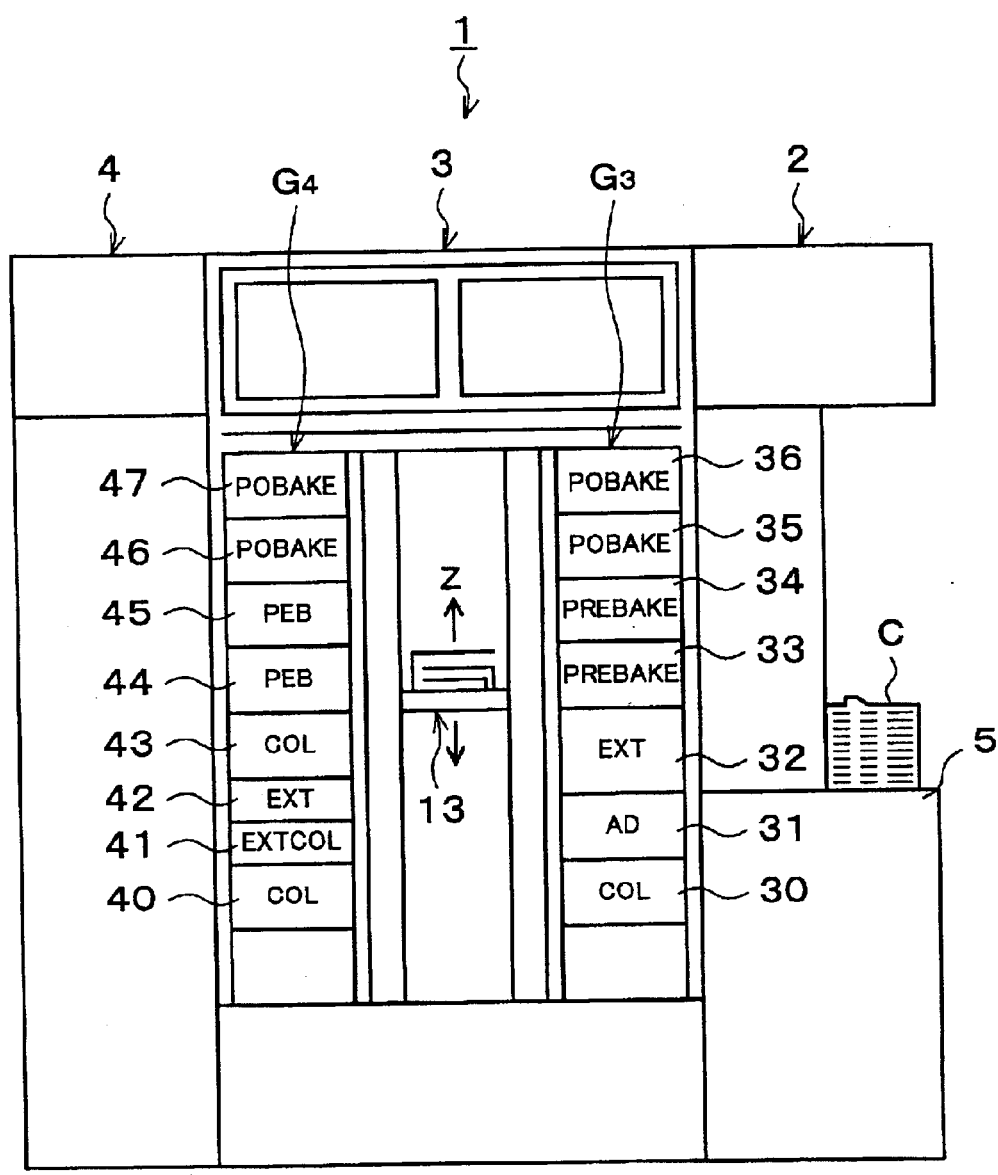
FIG. 3 is a rear view of the coating and developing treatment system in FIG. 1.

A preferred embodiment of the present invention will be explained. FIG. 1 is a plan view showing a sketch of a coating and developing treatment system 1 including a developing treatment unit as a solution treatment unit according to this embodiment, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W per cassette, as a unit, from/to the outside into/out of the coating and developing treatment system 1 and carrying the wafer W into/out of a cassette C, a processing station 3 in which various kinds of treatment units each for performing predetermined treatment for the wafers W one by one in coating and developing treatment processes are stacked in multiple tiers, and an interface section 4 for receiving/sending the wafer W from/ to an aligner not illustrated but provided adjacent to the processing station 3 are integrally connected.

In the cassette station 2, a plurality of cassettes C can be mounted at predetermined positions on a cassette mounting table 5 which is a mounting portion in a line in an R-direction (a top-to-bottom direction in FIG. 1). A wafer carrier 7 which is movable in the direction of arrangement of the cassettes (the R-direction) and in the direction of arrangement of the wafers W housed in the cassette C (a Z-direction; a vertical direction) is provided to be movable along a carrier guide 8 so as to selectively get access to each cassette C.

The wafer carrier 7 has an alignment function of aligning the wafer W. The wafer carrier 7 is structured to be able to get access also to an extension unit 32 included in a third treatment unit group G3 on the processing station 3 side as will be described later.

In the processing station 3, a main carrier device 13 is provided at the center thereof, and various kinds of treatment units are stacked in multiple tiers around the main carrier device 13 to compose treatment unit groups. In the coating and developing treatment system 1, four treatment unit groups G1, G2, G3, and G4 are disposed. The first and second treatment unit groups G1 and G2 are disposed on the front side of the coating and developing treatment system 1, the third treatment unit group G3 is disposed adjacent to the cassette station 2, and the fourth treatment unit group G4 is disposed adjacent to the interface section 4. Further, a fifth treatment unit group G5 shown by a broken line can be additionally disposed on the rear side as an option. The main carrier device 13 can carry the wafer W into/out of undermentioned various treatment units arranged in these treatment unit groups G1, G2, G3, G4, and G5. It should be noted that the number and disposition of treatment unit groups are different depending on the type of treatment given to the wafer W, and the number of treatment unit groups can be selected optionally if it is one or more.

In the first treatment unit group G1, for example, as shown in FIG. 2, a resist coating unit 17 for supplying a resist solution to the wafer W to form a resist film on the wafer W and a developing treatment unit 18 according to this embodiment are stacked in two tiers from the bottom in order. Similarly, in the second treatment unit group G2, a resist coating unit 19 and a developing treatment unit 20 are stacked in two tiers from the bottom in order.

In the third treatment unit group G3, for example, as shown in FIG. 3, a cooling unit 30 for subjecting the wafer W to cooling treatment, an adhesion unit 31 for enhancing the adhesion of the resist solution and the wafer W, an extension unit 32 for making the wafer W wait therein, pre-baking units 33 and 34 each for drying a solvent in the resist solution, post-baking units 35 and 36 each for performing baking treatment after developing treatment, or the like are stacked, for example, in seven tiers from the bottom in order.

In the fourth treatment unit group G4, for example, a cooling unit 40, an extension and cooling unit 41 for naturally cooling the wafer W mounted therein, an extension unit 42, a cooling unit 43, post-exposure baking units 44 and 45 each for performing baking treatment after exposure, post-baking units 46 and 47, or the like are stacked, for example, in eight tiers from the bottom in order.

A wafer carrier 50 is provided at the center of the interface section 4. This wafer carrier 50 is structured to be movable in the R-direction (the top-to-bottom direction in FIG. 1) and in the Z-direction (the vertical direction) and rotatable in a θ-direction (a direction of rotation around a Z-axis) so as to get access to the extension and cooling unit 41 and the extension unit 42 included in the fourth treatment unit group G4, an edge exposure unit 51, and the aligner not illustrated to carry the wafer W to each of them.

Figure 4:
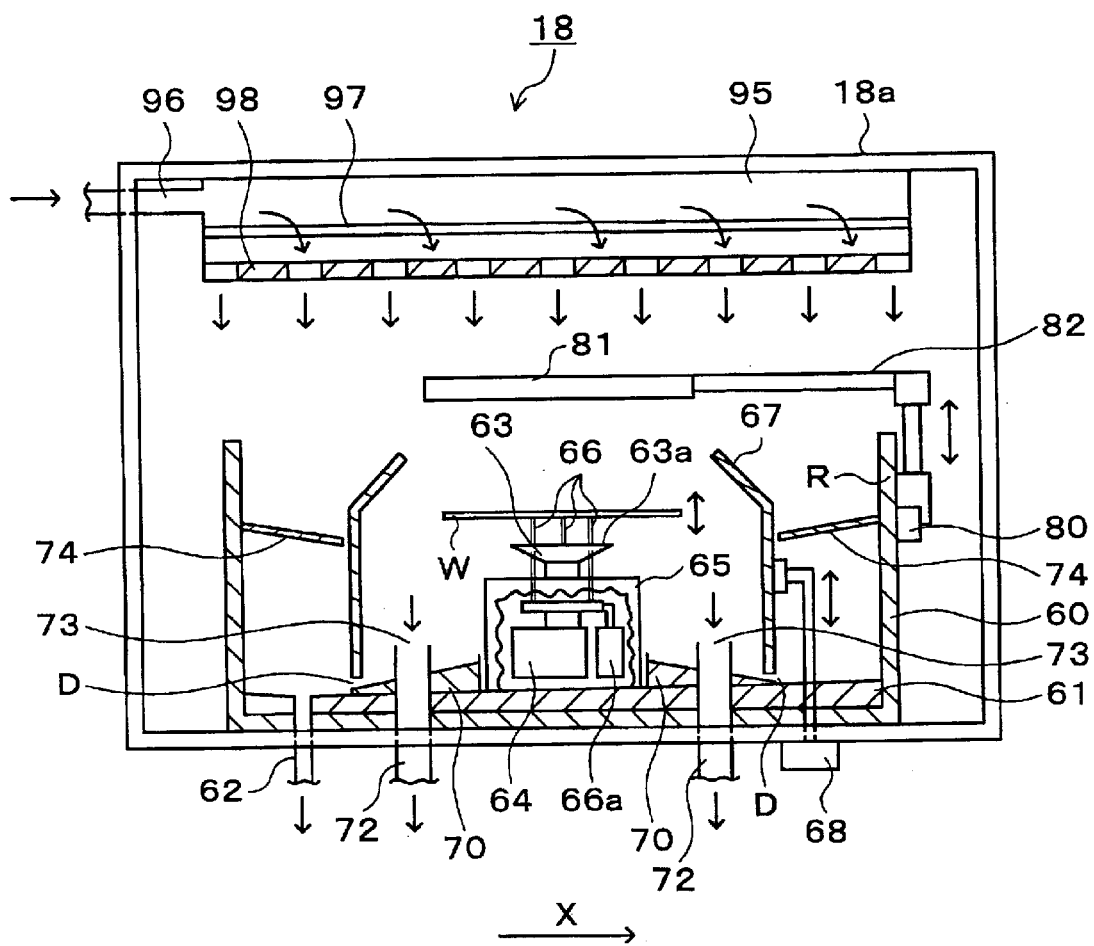
FIG. 4 is an explanatory view of a vertical section of the developing treatment unit according to the embodiment.
Figure 5:
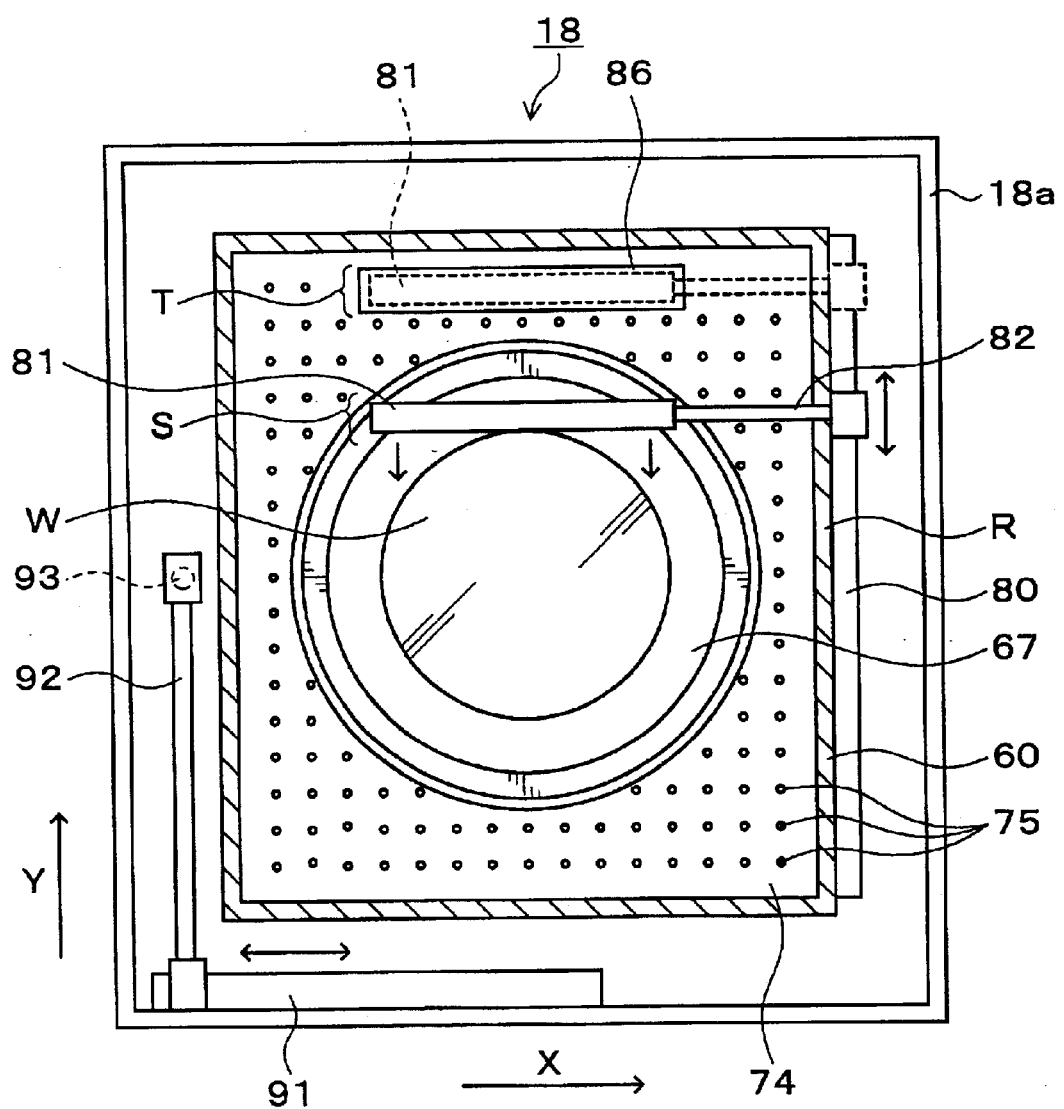
FIG. 5 is an explanatory view of a horizontal section of the developing treatment unit in FIG. 4.

Next, the structure of the aforementioned developing treatment unit 18 will be explained in detail. FIG. 4 is an explanatory view of a vertical section showing a sketch of the developing treatment unit 18, and FIG. 5 is an explanatory view of a horizontal section of the developing treatment unit 18.

As shown in FIG. 4, the developing treatment unit 18 includes a cup accommodating section 60 as an almost box-shaped treatment container with its upper face open in a casing 18a. In the bottom of the cup accommodating section 60, a base plate 61 as a bottom portion is provided. In the base plate 61 and near a side wall of the cup accommodating section 60, a drain port 62 for draining a treatment solution such as a developing solution, a cleaning solution, or the like used in the cup accommodating section 60 is provided. An upper face of the base plate 61 is inclined in such a manner that a position at which the drain port 62 is provided is the lowest position, and hence the treatment solution which has fallen on the base plate 61 flows into the drain port 62 along the inclined base plate 61 and drained from the drain port 62. Polypropylene, for example, which is nonmetallic is used as a material for the base plate 61.

A spin chuck 63 for holding the wafer W is provided in the center of the cup accommodating section 60. The spin chuck 63 has an upper face portion 63a whish is formed to be horizontal and circular so as to be able to hold the wafer W horizontally. A suction port not illustrated, for example, is provided in the upper face portion 63a so that the wafer W does not shift nor fall from the upper face portion 63a.

A drive mechanism 64 for rotating the spin chuck 63 is provided under the spin chuck 63. The drive mechanism 64 has a driver not illustrated including a motor and the like, a power source for supplying electric power to the driver, and a controller for controlling the power source. The wafer W held by the spin chuck 63 can be rotated at a predetermined rotation speed by this drive mechanism 64. The lower portion of the spin chuck 63 is covered with a bracket 65 for shutting out particles caused by the motor and the like.

A plurality of, for example, three raising and lowering pins 66 for raising and lowering the wafer W on the upper face portion 63a is provided in the spin chuck 63. The raising and lowering pins 66 penetrate a peripheral portion of the upper face portion 63a and freely protrude through the upper face portion 63a from below. The raising and lowering pins 66 can be raised and lowered to predetermined heights by a raising and lowering mechanism 66a.

A cup 67 as an inner container surrounding the outer periphery of the horizontally held wafer W is provided around the spin chuck 63. The cup 67 has an almost cylindrical shape with its upper and lower faces open. The developing solution and the like scattered when the wafer W is rotated are caught by this cup 67 and fall on the base plate 61. An upper portion of the cup 67 inclines inwardly to effectively prevent the scattering of the developing solution. The cup 67 has a raising and lowering drive mechanism 68 including a driver such as a cylinder for raising and lowering the cup 67, and hence the cup 67 can be raised and lowered appropriately to predetermined heights. Thus, a gap D can be provided between a lower end of the cup 67 and the base plate 61.

Figure 6:
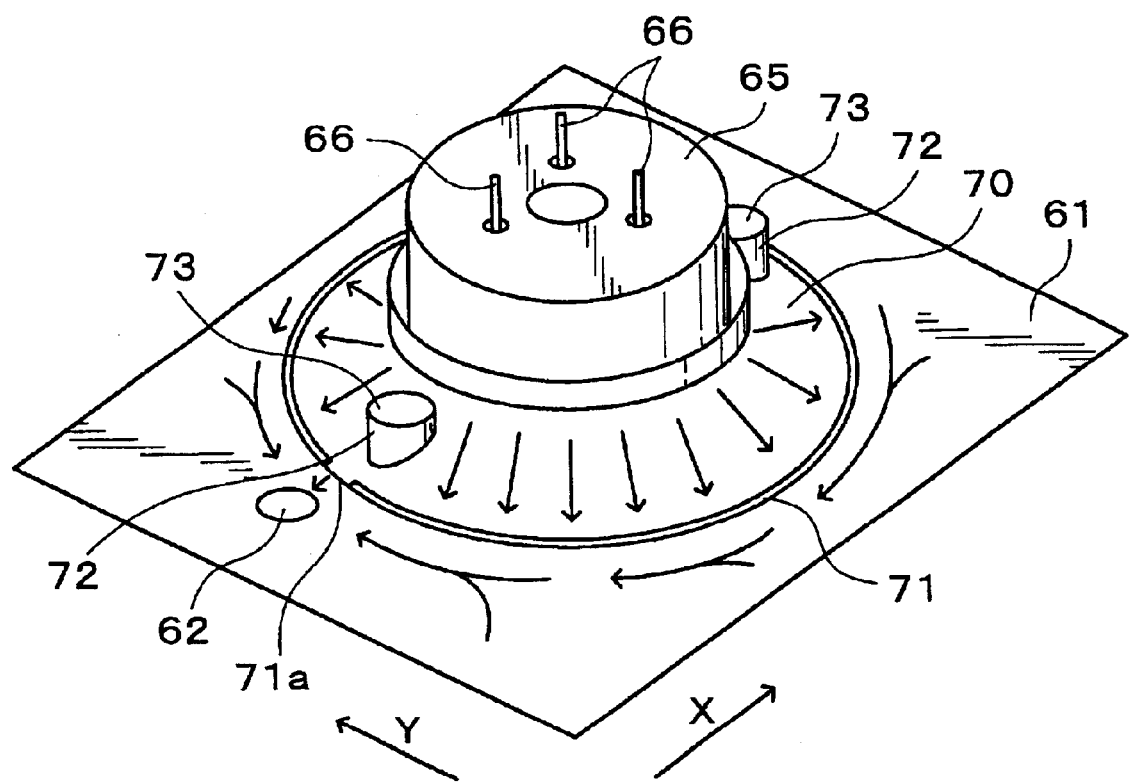
FIG. 6 is a perspective view of the interior of a cup accommodating section of the developing treatment unit from which a cup and a spin chuck are removed.
Figure 7:
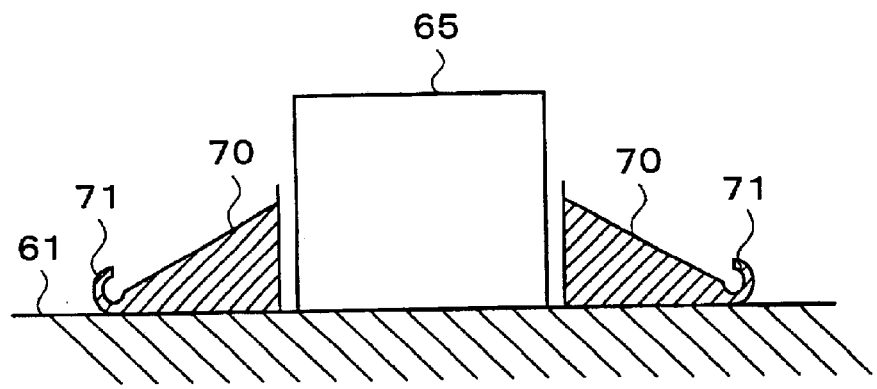
FIG. 7 is a vertical sectional view of an inclined plate.

Inside the cup 67 and on the base plate 61, an inclined plate 70 which is inclined for catching the developing solution and the like which have fallen within the cup 67. As shown in FIG. 6, the inclined plate 70 has an annular shape which becomes higher toward the center and it is provided to surround the bracket 65. The inclined plate 70 becomes lower from the center to the outer side. At the outer edge of the inclined plate 70, as shown in FIG. 7, a gutter 71 for catching and collecting the treatment solution such as the developing solution flowing along the inclined plate 70 is provided. At a position closest to the drain port 62 of the gutter 71, a cut-out 71a is provided as shown in FIG. 6, and hence the treatment solution which has flowed in the gutter 71 flows from the cut-out 71a onto the base plate 61, and it is then drained from the drain port 62.

Exhaust pipes 72 for exhausting an atmosphere in the cup accommodating section 60 are provided at plural positions in an inclined plane of the inclined plate 70. The exhaust pipes 72 are provided to protrude through the inclined plane of the inclined plate 70 from below, and the exhaust port 73 of each of the exhaust pipes 72 is open at a position higher that the inclined plane of the inclined plate 70. Therefore, the treatment solution flowing along the inclined plate 70 is prevented from flowing into the exhaust pipes 72. The exhaust pipes 72 are connected to a duct on the factory side not illustrated, and hence the atmosphere within the cup accommodating section 60 is sucked out by a fan provided in the duct.

As shown in FIG. 4, a flat collecting plate 74 for shutting out and collecting the treatment solution flowing into a space between the cup 67 and the cup accommodating section 60 is provided around the outer periphery of the cup 67. Numerous ventilation holes 75 are provided in the collecting plate 74 as shown in FIG. 5. The collecting plate 74 is provided slantwise so that the cup 67 side thereof is lower. The treatment solution collected by the collecting plate 74 flows along an inclination and falls on the base plate 61, for example, from a gap between the collecting plate 74 and the cup 67. An air current flowing into the space between the cup 67 and the cup accommodating section 60 passes through the ventilation holes 75 and is exhausted from the exhaust ports 73 through the gap D at the lower end of the cup 67.

For example, a rail 80 extending in a Y-direction is provided on a side wall R of the cup accommodating section 60 on the positive side of the X-direction. The rail 80 is provided from one end to the other end of the side wall R. An arm portion 82 for holding a developing solution supply nozzle 81 as a treatment solution supplier is provided on the rail 80. The arm portion 82 is provided with a moving mechanism not illustrated for moving the arm portion 82 along the rail 80, and the movement of the arm portion 82 is controlled by this moving mechanism. Thereby, the arm portion 82 can move to any position on the rail 80 and can move the developing solution supply nozzle 81 from a standby position T (shown in FIG. 5) situated on the positive side of the Y-direction to the outside of the wafer W on the negative side of the Y-direction. A driver not illustrated including a cylinder and the like for moving the arm portion 82 vertically is provided in the arm portion 82 so that the distance between the developing solution supply nozzle 81 and the wafer W can be adjusted.

Figure 8:
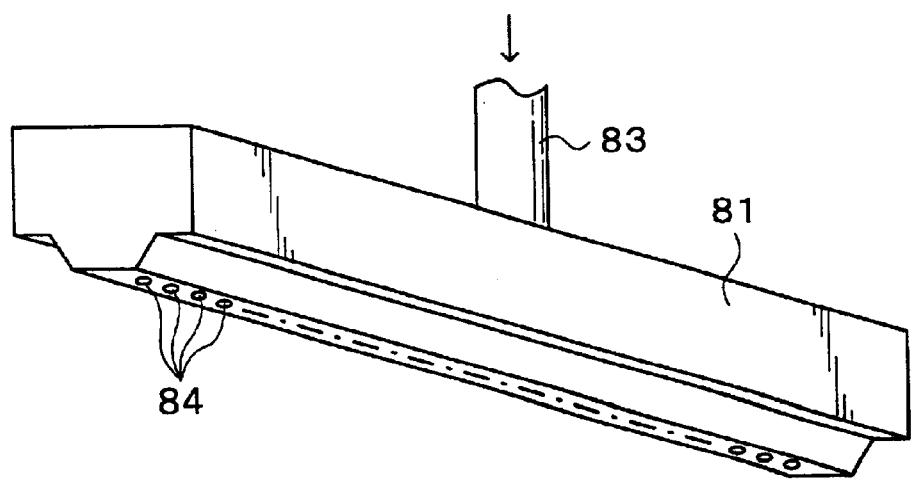
FIG. 8 is a perspective view of a developing solution supply nozzle.

The arm portion 82 holds the developing solution supply nozzle 81 in such a manner that the developing solution supply nozzle 81 passes over the wafer W when the arm portion 82 moves in the Y-direction. The developing solution supply nozzle 81 has a slender shape which is long in the X-direction, and is formed to have a length at least longer than the diameter of the wafer W. As shown in FIG. 8, a supply pipe 83 for letting the developing solution from a developing solution supply source not illustrated flow into the developing solution supply nozzle 81 is connected to the upper portion of the developing solution supply nozzle. In the lower portion of the developing solution supply nozzle 81, a plurality of developing solution discharge ports 84 having the same diameter are provided in a line in the longitudinal direction thereof. The developing solution supplied from the supply pipe 83 into the developing solution supply nozzle 81 is discharged from the developing solution discharge ports 84 simultaneously at the same flow rate.

Such a structure enables the developing solution supply nozzle 81 to discharge the developing solution at a predetermined flow rate while moving at a predetermined speed in the Y-direction to supply the developing solution over the entire surface of the wafer W and form a film of the developing solution with a predetermined film thickness on the wafer W.

Figure 9:
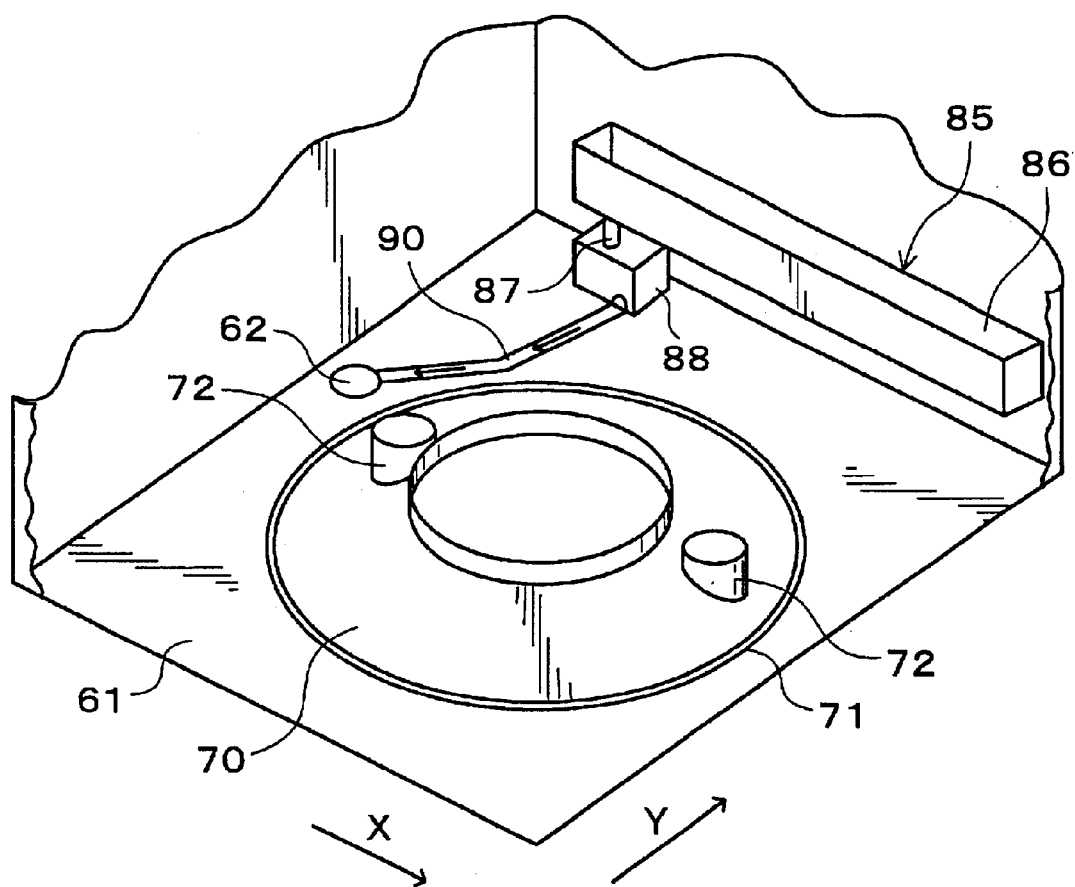
FIG. 9 a perspective view of the interior of the cup accommodating section from which the cup and the spin chuck are removed.

As shown in FIG. 9, a cleaning device 86 for cleaning the developing solution supply nozzle 81 is provided near the side wall on the positive side of the Y-direction within the cup accommodating section 60. The cleaning device 85 has a cleaning bath 86 for storing a cleaning solution, for example, pure water, a support post 87 for supporting the cleaning bath 87, and a fixing member 88 for fixing the lower end of the support port 87 and fixing the cleaning device 85 to the base plate 61. The cleaning bath 86 has a container shape with its upper face open and stores the cleaning solution therein. The cleaning bath 86 is situated at the standby position T of the developing solution supply nozzle 81 as shown in FIG. 5, and the developing solution supply nozzle 81 is put in the cleaning bath 86 and cleaned when returned to the standby position T.

Figure 10:
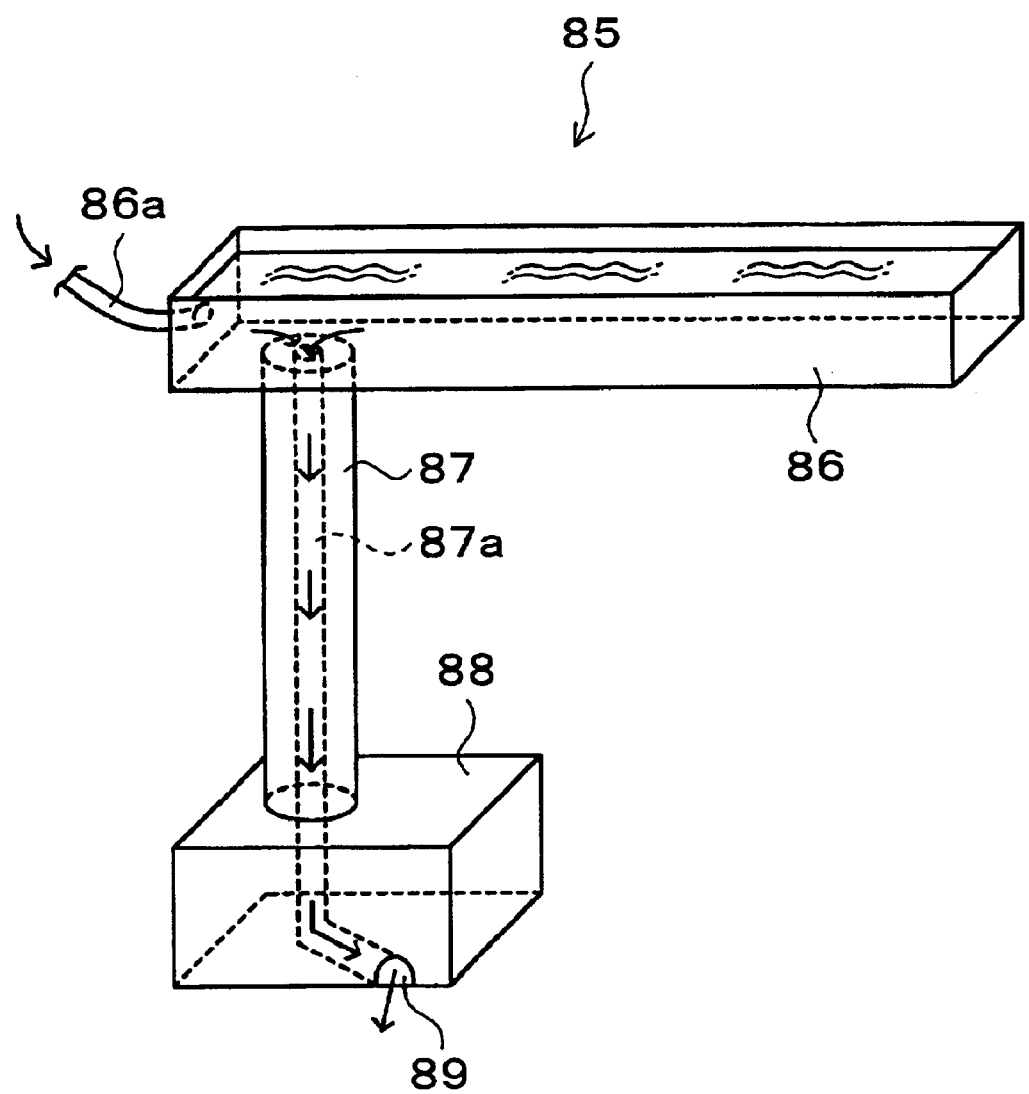
FIG. 10 is a perspective view showing a sketch of the structure of a cleaning device.

As shown in FIG. 10, a supply pipe 86a for supplying the cleaning solution from a cleaning solution supply source not illustrated into the cleaning bath 86 is attached to the cleaning bath 86. Meanwhile, a conduit 87a for letting out the cleaning solution is provided in the bottom of the cleaning bath 86. The conduit 87a extends from the bottom of the cleaning bath 86 to the fixing member 88 through the inside of the support post 87, so that the cleaning solution is let out from an outlet 89 provided in the fixing member 88 onto the base plate 61. Accordingly, cleaning solutions can be changed by letting out the cleaning solution from the cleaning bath 86 through the conduit 87a and supplying a new cleaning solution from the supply pipe 86a into the cleaning bath 86. Moreover, as shown in FIG. 9, a ditch 90 as a guide path for guiding the cleaning solution let out from the outlet 89 from the outlet 89 to the drain port 62 of the base plate 61 is provided.

As shown in FIG. 5, a rail 91 extending in the X-direction is provided outside the cup accommodating section 60 on the negative side of the Y-direction. An arm 92 is provided to be freely movable above the rail 91. The arm 92 is provided with a drive mechanism not illustrated for moving the arm 92 along the rail 91. A cleaning solution supply nozzle 93 for supplying the cleaning solution to the wafer W is provided at the tip of the arm 92. The cleaning solution supply nozzle 93 is attached so as to be situated above the center of the wafer W when the arm 92 moves to a position above the diameter of the wafer W. The cleaning solution supply nozzle 93 is moved to a position above the center of the wafer W with the movement of the arm 92 at a predetermined point in time and can supply the cleaning solution to the wafer W. Incidentally, the arm 92 is provided with a moving mechanism not illustrated which enables the arm 92 to move vertically, and hence the distance between the wafer W and the arm 92 can be adjusted as necessary.

As shown in FIG. 4, an air supply mechanism 95 for supplying a gas such as air into the cup accommodating section 60 is provided above the cup accommodating section 60. An air supply pipe 96 for supplying air to the air supply mechanism 95 from an air supply source not illustrated outside the casing 18a is connected to the air supply mechanism 95. The air supply mechanism 95 includes a filter 97 for trapping impurities contained in air and a current plate 98 for rectifying an air current in order to supply air uniformly into the cup accommodating section 60. The air supplied from the air supply mechanism 95 is exhausted from the under exhaust pipe 72, and hence a descending air current is formed within the cup accommodating section 60. On this occasion, a predetermined atmosphere is substituted for the atmosphere in the cup accommodating section 60, and hence impurities and the like produced by developing treatment are removed.

Next, the operation of the developing treatment unit 18 structured as above will be explained with a photolithography process performed in the coating and developing treatment system 1.

First, the wafer carrier 7 takes one untreated wafer W out of the cassette C and carries it into the adhesion unit 31 included in the third treatment unit group G3. The wafer W coated with an adhesion promoter such as HMDS for enhancing the adhesion to the resist solution in the adhesion unit 31 is carried to the cooling unit 30 by the main carrier device 13 and cooled to a predetermined temperature. The wafer W is then carried to the resist coating unit 17 or 19 and the prebaking unit 33 or 34 in sequence and subjected to predetermined treatment. Thereafter, the wafer W is carried to the extension and cooling unit 41.

Subsequently, the wafer W is taken out of the extension and cooling unit 41 by the wafer carrier 50, and then carried to the aligner (not illustrated) via the edge exposure unit 51. The wafer W which has undergone exposure processing is carried to the extension unit 42 by the wafer carrier 50 and then held by the main carrier device 13. Thereafter, the wafer W is carried to the post-exposure baking unit 44 or 45 and the cooling unit 43 in sequence, in each of which the wafer W is subjected to predetermined treatment, and then carried to the developing treatment unit 18 or 20.

The wafer W which has undergone developing treatment is carried to post-baking unit 35, 36, 46 or 47 and the cooling unit 30 in sequence again by the main carrier device 13 and subjected to predetermined treatment in each unit. Thereafter, the wafer W is returned to the cassette C by the wafer carrier 7 via the extension unit 32, and successive predetermined coating and developing treatment is completed.

Next, the operation of the aforementioned developing treatment unit 18 will be explained in detail. First, before developing treatment is started (before the wafer W is received), the supply of air controlled at predetermined temperature and humidity from the air supply mechanism 95 into the cup accommodating section 60 is started, and a uniform descending air current is formed within the cup accommodating section 60. Moreover, the atmosphere in the cup accommodating section 60 is exhausted from the exhaust pipes 72 always at a constant flow rate, and the interior of the cup accommodating section 60 is purged.

When the developing treatment is started, the raising and lowering pins 66 are first raised to a position higher than the upper end face of the cup 67 by the raising and lowering mechanism 66a. Then, the main carrier device 13 gets into the casing 18a, and the wafer W is delivered onto the raising and lowering pins 66. Subsequently, the cup 67 is lowered by the raising and lowering drive mechanism 68, so that the position of the cup 67 is lowered and also the raising and lowering pins 66 are lowered. Thus, the wafer W is located at a position slightly higher than the upper end face of the cup 67, for example, about 1 mm higher than the cup 67.

Thereafter, the developing solution supply nozzle 81 which has been waiting in the cleaning bath 86 is moved from the cleaning bath 86 to a position S inside the cup 67 and outside the wafer W as shown in FIG. 5. At this position S, the developing solution supply nozzle 81 starts to discharge the developing solution, and continues trial discharge until its discharge condition becomes stable. The developing solution discharged by way of trial at this time mainly falls on the inclined plate 70. The developing solution which has fallen on the inclined plate 70 is collected by the gutter 71 of the inclined plate 70 owing to an inclination as shown in FIG. 6. The developing solution collected by the gutter 71 flows along the gutter 71 and is let out from the cut-out 71a onto the base plate 61. Since the base plate 61 is inclined, the developing solution let out onto the base plate 61 is guided to the drain port 62, and let out from the drain port 62, for example, to a treatment solution tank not illustrated outside the developing treatment unit 18. Meanwhile, the developing solution which has fallen on the colleting plate 72 also finally falls on the base plate 61 and is guided to the drain port 62 due to an inclination of the inclined plate 61 and drained.

When the discharge condition of the developing solution is stabilized, the developing solution supply nozzle 81 moves to the negative side of the Y-direction above the wafer W while discharging the developing solution. On this occasion, the developing solution is supplied to the entire surface of the wafer W, and a film of the developing solution is formed on the wafer W. Although the developing solution falls on the inclined plate 70 from the wafer W and the developing solution supply nozzle 81, such a developing solution which has fallen is let out from the cut-out 71 a of the inclined plate 70 onto the base plate 61 and drained from the drain port 62 as in the case of the aforementioned trial discharge. Thereafter, the developing solution supply nozzle 81 comes to a stop outside the wafer W on the negative side of the Y-direction, stops the supply of the developing solution, and returns to the standby position T.

When the film of the developing solution is formed on the wafer W, so-called developing in stationary condition is started. At this time, it is suitable to raise the cup 67 so that the upper end face of the cup 67 becomes higher than the position of the wafer W. Hence, during the developing in stationary condition, the gap D becomes wider since the cup side portion 67 is raised, whereby air supplied from above mainly flows outside the cup 67, passes through the ventilation holes 75 of the collecting plate 74, flows into the cup 67 from the gap D, and is exhausted from the exhaust ports 72. Thereby, an air current around the wafer W weakens, and the temperature of the wafer W is maintained.

After the completion of the developing in stationary condition for a predetermined period of time, the raising and lowering pins 66 are lowered, so that the wafer W is suction-held on the spin chuck 63. On this occasion, the cup 67 is also lowered, and the wafer W is situated in the vicinity of the middle of the cup 67 when viewed from the side. Since the cup 67 is lowered at this time, the gap D is narrowed, whereby air supplied from above mainly flows into the cup 67 directly, and a strong descending air current is formed in the cup 67.

Subsequently, the cleaning solution supply nozzle 93 is moved to a position above the center of the wafer W along the rail 91 by a drive mechanism not illustrated of the arm 92. The wafer W is rotated at a predetermined rotation speed, for example, 2000 rpm by the spin chuck 63. When the rotation of the wafer W is started, the cleaning solution, for example, pure water is supplied to the center of the wafer W from the cleaning solution supply nozzle 93. Thereby, the pure water is spread over the entire surface of the wafer W, and the developing solution on the wafer W is cast off by centrifugal force. At this time, the treatment solutions of the developing solution and the pure water cast off by centrifugal force are caught by the cup 67 and fall on the inclined plate 70 from the cup 67. Similarly to the developing solution on the occasion of the aforementioned supply of the developing solution, the treatment solutions which have fallen on the inclined plate 70 are collected by the gutter 71, let out from the cut-out 71a onto the base plate 61, and drained from the drain port 62 of the base plate 61. Meanwhile, an atmosphere in the cup 67 contains mist produced from the developing solution and the like by the casting. This atmosphere is lowered by the descending air current in the cup 67 and exhausted from the exhaust pipes 72 to the factory side.

After a predetermined period of time, the discharge of the pure water is stopped, and the rotation speed of the wafer W is increased, for example, to 4000 rpm. Thereby, the pure water on the wafer W is cast off, and the wafer W is dried. After the drying is performed for a predetermined period of time, the rotation of the wafer W is stopped, and the drying processing is completed. Incidentally, the pure water scattered in the drying processing is drained from the drain port 62 along the inclined plate 70 and the base plate 61 as in the case of the aforementioned casting of the developing solution and the like.

When the drying processing is completed, the wafer W is raised again to a position higher the upper end of the cup 67 by the raising and lowering pins 66. The wafer W is then delivered to the main carrier unit 13 in the same manner as in carry-in, and carried out of the casing 18a. Successive developing treatment is thus completed.

Next, the operation of the cleaning device 85 in the change of cleaning solutions will be explained. For example, after the developing solution supply nozzle 81 moves from the cleaning bath 86 to the position S in order to supply the developing solution to the wafer W, the cleaning solution in the cleaning bath 86 is let out from the outlet 89 onto the base plate 61 through the conduit 87a. The cleaning solution let out onto the base plate 61 flows along the ditch 90 and is then drained from the drain port 62. Subsequently, a new cleaning solution is supplied from the supply pipe 86a into the cleaning bath 86 and stored. Thereafter, the developing solution supply nozzle 81 which has completed the discharge of the developing solution is returned to the standby position T and put into the cleaning bath 86, where the dirty developing solution supply nozzle 81 is cleaned. It should be mentioned that the change of cleaning solutions may be performed every time one wafer W is treated or every time one lot is completed.

In the aforementioned embodiment, the exhaust ports 73 of the exhaust pipes 72 are provided at positions higher than the inclined plate 70, whereby the treatment solution used in developing treatment is prevented from flowing into the exhaust ports 72, and hence the treatment solution and the atmosphere in the cup 67 are let out separately.

Moreover, the base plate 61 is provided in the cup accommodating section 61, and the base plate 61 is inclined so that the drain port 62 is provided at the lowest position, whereby the treatment solution or the like which has fallen on the base plate 61 is guided to the drain port 62 and drained without collecting on the base plate 61.

The inclined plate 70 is provided on the base plate 61 at a position opposed to the inner side of the cup 67, the gutter 71 is provided at the outer edge of the inclined plate 70, and the cut-out 71a is provided in the gutter 71, whereby the treatment solution in the cup 67 falls on the inclined plate 70, and the treatment solution which has fallen is collected by the gutter 70 and let out from the cut-out 71a of the gutter 71 to the drain port 62. Accordingly, a large quantity of treatment solution falling on the inclined plate 70 can be suitably drained.

Further, since the cut-out 71a is provided on the drain port 62 side, the treatment solution let out from the cut-out 71a swiftly flows into the drain port 62 and is drained.

The outlet 89 is provided in the fixing member 88 of the cleaning device 85, and the cleaning solution of the cleaning bath 86 can be let out to the base plate 61, whereby the cleaning solution with other treatment solutions can be collectively drained from the drain port 62. Moreover, since the ditch 90 is provided between the outlet 89 and the drain port 62, the cleaning solution let out from the outlet 89 is suitably and certainly drained from the drain port 62.

The use of nonmetallic polypropylene as the material for the base plate 61 eliminates the dissolution of metallic ions in the treatment solution flowing on the base plate 61, whereby the operation of removing metallic ions can be omitted when the treatment solution is reused. Incidentally, a material having a hydrophilic nature such as ceramics, stainless steel or aluminum may be used as the material for the base plate 61. By using such a hydrophilic material, the treatment solution which has fallen can easily flow on the base plate 61, which prevents the treatment solution from remaining on the base plate 61.

Figure 11:
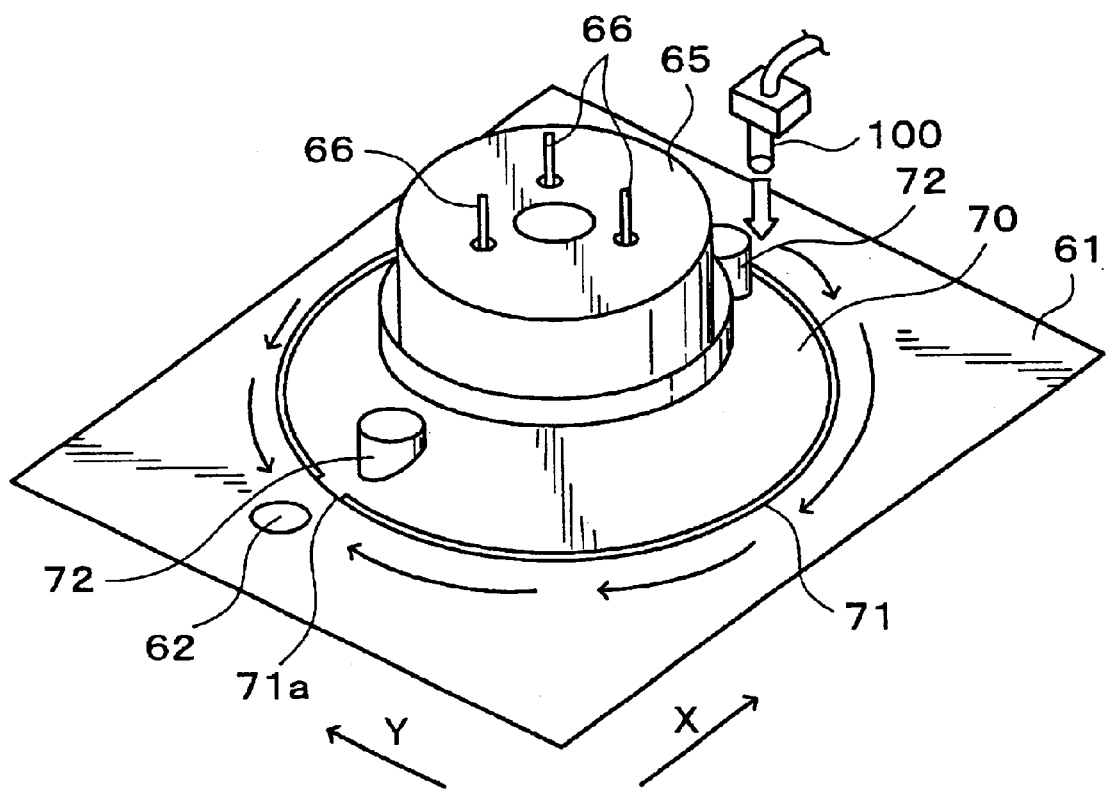
FIG. 11 is a perspective view of the interior of the cup accommodating section from which the cup and the spin chuck are removed when a supply nozzle is provided.

A supply device for supplying the cleaning solution, for example, pure water onto the base plate 61 may be provided in the developing treatment unit 18 described in the above embodiment. FIG. 11 shows an example in the case where a supply nozzle 100 as a supplier is provided, and the supply nozzle 100 is provided above the base plate 61 and in the vicinity of the side wall R of the cup accommodating section 60 on the positive side of the X-direction. The supply nozzle 100 is disposed so as to supply the cleaning solution to a position opposite to the drain port 62 and near the end portion which is highest on the base plate 61 on the positive side of the X-direction. At the same time when the wafer W is rotated and the supply of pure water from the cleaning solution supply nozzle 93 is started in the developing treatment process, for example, the cleaning solution is supplied onto the base plate 61 from the supply nozzle 100. The cleaning solution supplied to the highest position on the base plate 61 flows to the drain port 62 side along an inclination while engulfing the falling developing solution and pure water on its way, and is drained with the developing solution and the like from the drain port 62.

If the cleaning solution is supplied onto the base plate 61 as described above, the developing solution and the like which have fallen on the base plate 61 are allowed to flow to the drain port 62, and the upper face of the base plate 61 is cleaned. Accordingly, the base plate 61 is prevented from becoming dirty due to the developing solution and the like remaining on the base plate 61, whereby the base plate 61 can be kept clean. Incidentally, the timing of the supply of the cleaning solution from the supply nozzle 100 is optional, and the supply may be started when the trial discharge of the developing solution is started, or the developing solution may be supplied at all times.

Figure 12:
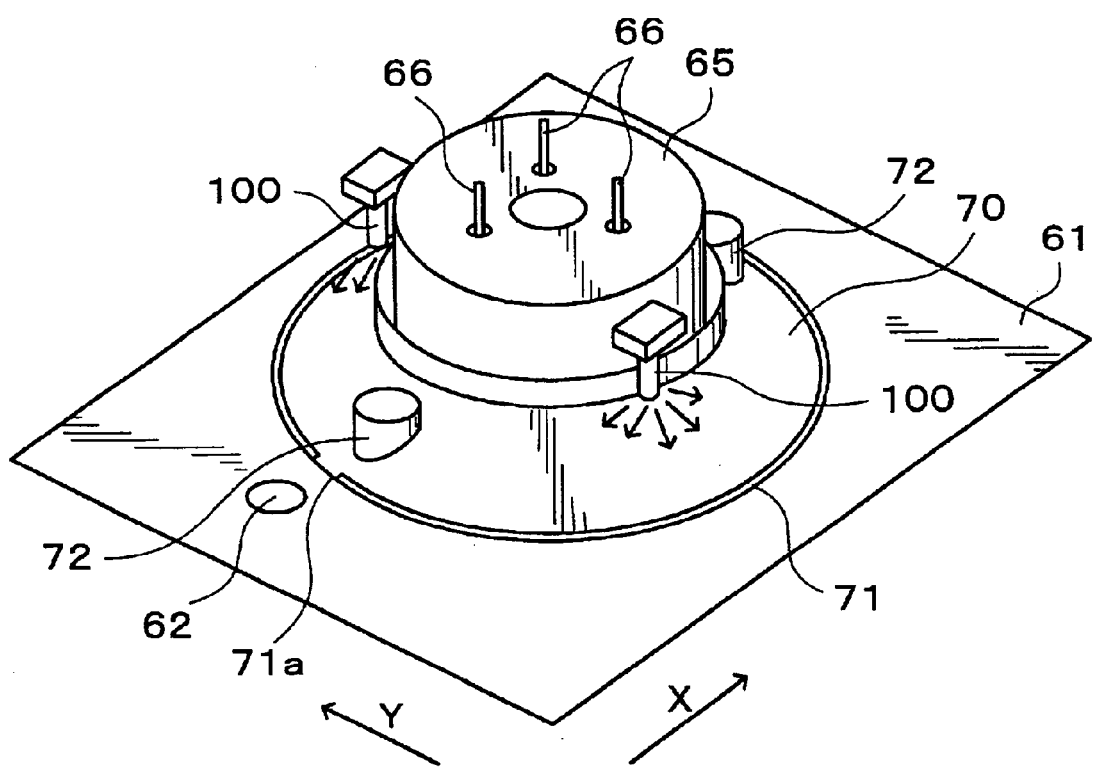
FIG. 12 is a perspective view of the interior of the cup accommodating section in another example.

As shown in FIG. 12, the supply nozzle 100 may be provided so as to supply the cleaning solution onto the inclined plate 70. By supplying the cleaning solution onto the inclined plate 70 as described above, the developing solution and the like which have fallen on the inclined plate 70 in the cup 67 are carried away by the cleaning solution, and the drain of the developing solution and the like is accelerated. Accordingly, the developing solution is prevented from remaining in the gutter 71 of the inclined plate 70 and the like, and hence the inclined plate 70 can be cleaned.

Figure 13:
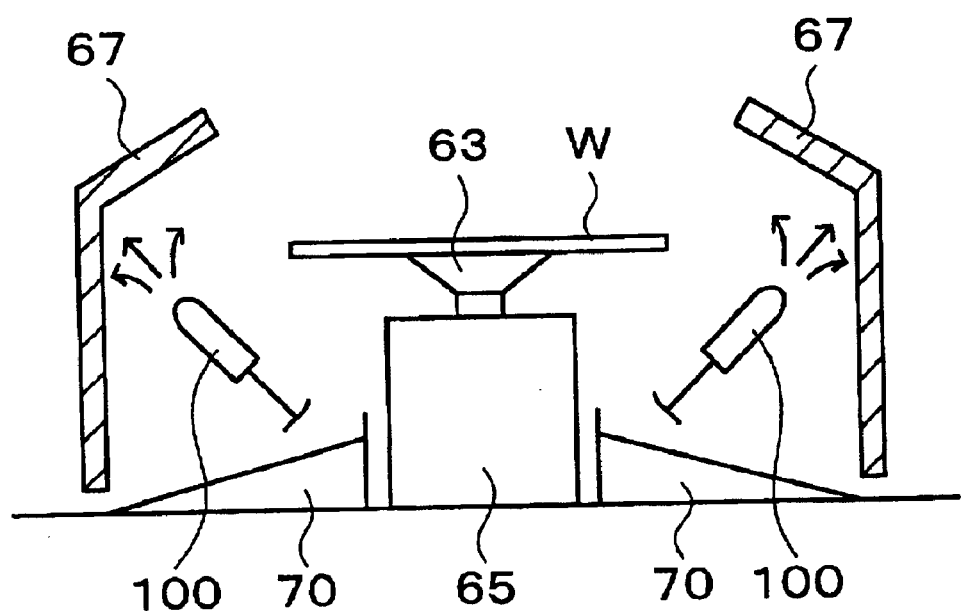
FIG. 13 is an explanatory view of a vertical section showing the structure of the interior of the cup when the supply nozzles are provided in the cup.

Moreover, as shown in FIG. 13, the supply nozzle 100 may be provided so as to supply the cleaning solution to the inner wall of the cup 67. By supplying the cleaning solution to the inner wall of the cup 67 by the supply nozzle 100, the developing solution and the like scattered from the wafer W and adhering to the inner wall of the cup 67 can be cleaned. Therefore, the developing solution and the like adhering to the inner wall of the cup 67 are prevented from being peeled off and causing particles. Incidentally, the supply nozzles 100 may be provided at a plurality of positions, and may be provided at all positions near the side wall R of the aforementioned cup accommodating section 60, above the inclined plate 70, and near the inner wall of the cup 67.

Figure 14:
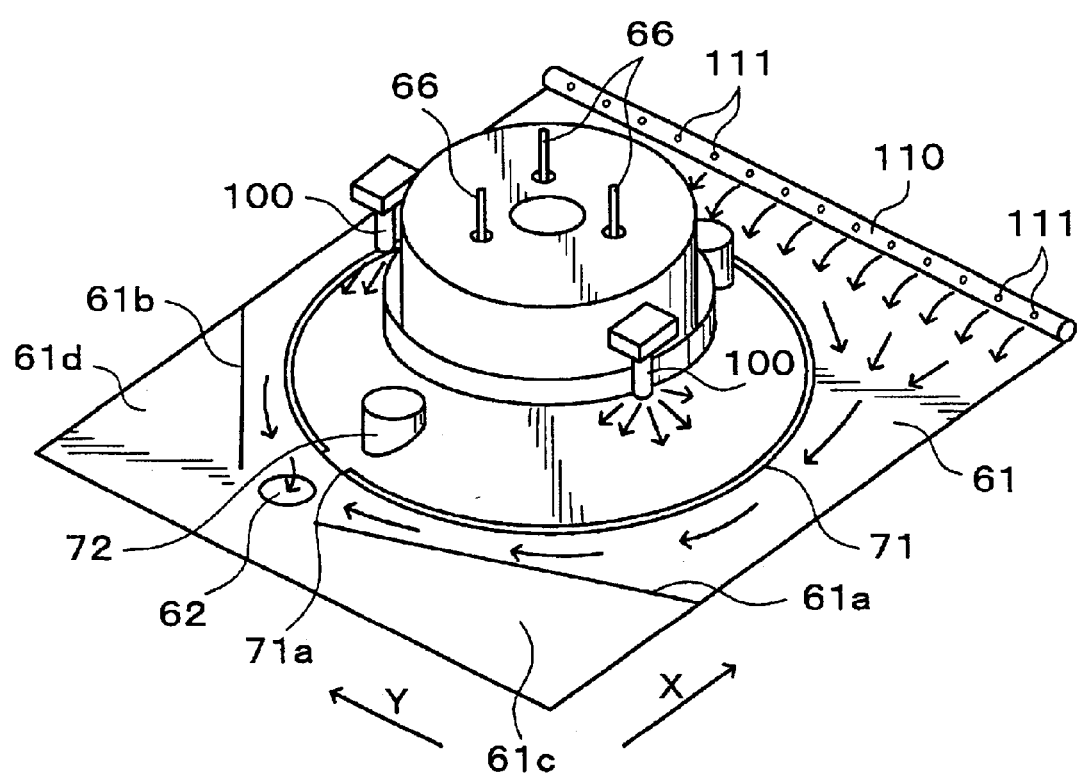
FIG. 14 is a perspective view of an example in which a supply member of a cleaning solution is provided at the highest position of an inclined base plate.

Further, as shown in FIG. 14, a supply member 110 for supplying the cleaning solution may be provided at the highest position of the inclined base plate 61. This supply member 110 has a pipe shape, and has numerous supply ports 111 on one side. The cleaning solution is discharged from the supply ports 111 toward the base plate 61. Since the base plate 61 is inclined, the cleaning solution flows along the surface of the base plate 61, and the surface of the base plate 61 is cleaned in this process. The cleaning solution then flows to the drain port 62. In this case, as shown in FIG. 14, if the base plate 61 is formed in such a manner that areas 61c and 61d on the outside of lines 61a and 61b which extend diagonally from both sides of the base plate 61 to the drain port 62 are inclined, all the cleaning solution from the supply ports 111 can be led to the drain port 62.

The embodiment explained above is an example in which the present invention is applied to a wafer developing treatment unit in a photolithography process of semiconductor wafer device fabrication processes, but the present invention can be also applied to a developing treatment unit for substrates other than a semiconductor wafer, for example, an LCD substrate. Although the aforementioned embodiment is an example in which the present invention is applied to the developing treatment unit, the present invention is not limited to the developing treatment unit but can be applied to solution treatment units in which a resist solution or other treatment solutions are used.

According to the present invention, the drain of a treatment solution and the exhaust of an atmosphere can be performed separately without being mixed, and hence pressure loss of a fan on the factory side which performs an exhaust operation can be reduced, whereby excess power consumption can be reduced. Accordingly, a reduction in running costs of a solution treatment unit can be realized. Moreover, the treatment solution in a treatment container is suitably drained, which prevents the interior of the treatment container from being contaminated, whereby the time and the number of times of maintenance are reduced, and with this reduction, a rise in throughput can be realized.

What is claimed is:

1. A solution treatment unit for supplying a treatment solution to a substrate to treat the substrate, comprising:
    a treatment container;
    an inner container provided in the treatment container and configured to surround an outer periphery of the horizontally held substrate, the upper and lower faces of the inner container being open;
    an exhaust pipe configured to exhaust an atmosphere in the treatment container, the exhaust pipe being provided in a bottom portion of the treatment container and inside the inner container, and an exhaust port of the exhaust pipe being open at a position higher than the bottom portion; and
    a drain port configured to drain the treatment solution in the treatment container and provided in the bottom portion,
    wherein an upper face of the bottom portion is inclined,
    wherein the drain port is provided at the lowest position of the inclined upper face, and
    wherein a supply member for supplying a cleaning solution to the bottom portion of the treatment container is provided at the highest position of the upper face of the inclined bottom portion.

2. A solution treatment unit as set forth in claim 1, wherein a supplier for supplying a cleaning solution to an inner wall of the treatment container is provided.

3. A solution treatment unit as set forth in claim 1, wherein a material having a hydrophilic nature is used at least for an upper face of the bottom portion.

4. A solution treatment unit as set forth in claim 1, wherein at least a material for an upper face of the bottom portion is nonmetallic.

5. A solution treatment unit for supplying a treatment solution to a substrate to treat the substrate, comprising:
    a treatment container;
    an inner container provided in the treatment container and configured to surround an outer periphery of the horizontally held substrate, the upper and lower faces of the inner container being open;
    an exhaust pipe configured to exhaust an atmosphere in the treatment container, the exhaust pipe being provided in a bottom portion of the treatment container and inside the inner container, and an exhaust port of the exhaust pipe being open at a position higher than the bottom portion; and a drain port configured to drain the treatment solution in the treatment container and provided in the bottom portion, wherein the bottom portion of the treatment container has an almost annular inclined plate which becomes higher to the center side, wherein the inclined plate is provided inside the inner container or under the inner container, wherein a gutter is provided along an outer edge of the inclined plate, and wherein a cut-out for letting the treatment solution in the gutter flow to the outside of the inclined plate is provided in the gutter.

6. A solution treatment unit as set forth in claim 5, wherein the cut-out is provided at a position closest to the drain port.

7. A solution treatment unit as set forth in claim 5, wherein a supplier for supplying a cleaning solution to an inner wall of the treatment container is provided.

8. A solution treatment unit as set forth in claim 5, wherein a material having a hydrophilic nature is used at least for an upper face of the bottom portion.

9. A solution treatment unit as set forth in claim 5, wherein at least a material for an upper face of the bottom portion is nonmetallic.

10. A solution treatment unit for supplying a treatment solution to a substrate to treat the substrate, comprising:

a treatment container;

an inner container provided in the treatment container and configured to surround an outer periphery of the horizontally held substrate, the upper and lower faces of the inner container being open;

an exhaust pipe configured to exhaust an atmosphere in the treatment container, the exhaust pipe being provided in a bottom portion of the treatment container and inside the inner container, and an exhaust port of the exhaust pipe being open at a position higher than the bottom portion; and a drain port configured to drain the treatment solution in the treatment container and provided in the bottom portion, wherein a cleaning device for cleaning a treatment solution supply nozzle for supplying the treatment solution to the substrate is provided in the treatment container, and wherein an outlet for letting out a cleaning solution used in the cleaning device onto the bottom portion is provided in the cleaning device.

11. A solution treatment unit as set forth in claim 10, wherein a guide path for guiding the cleaning solution from the outlet to the drain port is provided.

12. A solution treatment unit as set forth in claim 10, wherein a supplier for supplying a cleaning solution to an inner wall of the treatment container is provided.

13. A solution treatment unit as set forth in claim 10, wherein a material having a hydrophilic nature is used at least for an upper face of the bottom portion.

14. A solution treatment unit as set forth in claim 10, wherein at least a material for an upper face of the bottom portion is nonmetallic.

* * * * *